(12) United States Patent
Tsukamoto et al.

(10) Patent No.: US 6,174,736 B1
(45) Date of Patent: Jan. 16, 2001

(54) METHOD OF FABRICATING FERROMAGNETIC TUNNEL JUNCTION DEVICE

(75) Inventors: Yuji Tsukamoto; Hisanao Tsuge; Nobuyuki Ishiwata; Hisao Matsutera; Masafumi Nakada; Atsushi Kamijo, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/209,696

(22) Filed: Dec. 11, 1998

(30) Foreign Application Priority Data

Dec. 12, 1997 (JP) .................................................. 9-342592

(51) Int. Cl.[7] .................................................. H01L 21/00
(52) U.S. Cl. ................. 438/3; 428/610; 428/611; 428/626; 428/678; 427/28; 204/15
(58) Field of Search ................. 438/3; 428/610, 428/611, 678, 626; 427/28; 204/15

(56) References Cited

U.S. PATENT DOCUMENTS

| 3,657,075 | * | 4/1972 | Oshima et al. | 204/15 |
| 4,520,040 | * | 5/1985 | Cordts | 427/38 |
| 4,714,641 | * | 12/1987 | Cordts | 428/610 |
| 5,467,881 | | 11/1995 | Gill | 216/22 |
| 5,986,858 | * | 11/1999 | Sato et al. | 360/113 |

FOREIGN PATENT DOCUMENTS

| 5-63254 | 3/1993 | (JP) . |
| 6-244477 | 9/1994 | (JP) . |
| 8-45031 | 2/1996 | (JP) . |
| 8-70148 | 3/1996 | (JP) . |
| 8-70149 | 3/1996 | (JP) . |
| 8-316548 | 11/1996 | (JP) . |
| 9-106514 | 4/1997 | (JP) . |

OTHER PUBLICATIONS

N. Tezuka et al., "Relationship between the barrier and magnetoresistance effect in ferromagnetic tunneling junctions", J. Japan Magnetic Soc., vol. 21: 4, (1997) pp. 493–496.

J.S. Mooders et al., "Ferromagnetic–insulator–ferromagnetic tunneling: Spin–dependent tunneling and large magnetoresistance in trilayer junctions (invited)", J. App. Phy. 79:6, 1996, pp.4724–4729.

* cited by examiner

Primary Examiner—Richard Elms
Assistant Examiner—Pho Luu
(74) Attorney, Agent, or Firm—Foley & Lardner

(57) ABSTRACT

There is provided a method of fabricating a ferromagnetic tunnel junction device, including the steps of (a) forming a first ferromagnetic layer on a substrate, (b) forming a tunnel barrier layer on the first ferromagnetic layer, (c) forming a second ferromagnetic layer on the tunnel barrier layer, (d) mechanically polishing end surfaces of the first ferromagnetic layer, the tunnel barrier layer, and the second ferromagnetic layer, and (e) etching the surfaces of the first ferromagnetic layer, the tunnel barrier layer, and the second ferromagnetic layer. The method provides a ferromagnetic tunnel junction device having a height defined with high accuracy, and including a tunnel barrier layer keeping first and second ferromagnetic layers in electrical isolation with each other.

14 Claims, 2 Drawing Sheets

METHOD OF FABRICATING FERROMAGNETIC TUNNEL JUNCTION DEVICE

BACKGROUND OF THE INVENTION

1. Field of the Invention

The invention relates to a method of fabricating a ferromagnetic tunnel junction device, and more particularly to a method of a ferromagnetic tunnel junction device used for a sensor for reading a magnetic head in an apparatus for reading a high density magnetic disc.

2. Description of the Related Art

Some of conventional ferromagnetic tunnel junction devices are designed to include a pair of ferromagnetic layers, and a tunnel barrier layer sandwiched between the ferromagnetic layers and composed of an electrical insulator with a few nanometer thickness. When an external magnetic field is applied to the ferromagnetic layers with a constant current being applied across the ferromagnetic layers, there appears magneto-resistance effect where a resistance varies in dependence on a relative angle formed between orientations of magnetization of the ferromagnetic layers.

When the orientations of magnetization are parallel with each other, a resistance is minimum, and when the orientations of magnetization are not parallel with each other, a resistance is maximum. Hence, it is possible to make the orientations of magnetization in parallel or non-parallel with each other in accordance with an intensity of an applied magnetic field by providing a difference in coercive force to the ferromagnetic layers. This means that an intensity of a magnetic field can be detected by monitoring variation in a resistance.

Recently, there has been obtained a ferromagnetic tunnel junction device which includes a tunnel barrier layer comtposed of a film obtained by oxidizing a surface of an aluminum layer, to thereby provide about 20% of a magneto-resistance ratio. This ferromagnetic tunnel junction device is able to be applied to a magnetic head, a magnetic memory, and so on. Such a ferromagnetic tunnel junction device with a high magneto-resistance ratio is suggested, for instance, in Journal of Applied Physics, Vol. 79, April 1996, pp. 4724–4729.

In fabrication of the above-mentioned ferromagnetic tunnel junction device with a high magneto-resistance ratio, a first ferromagnetic layer composed of CoFe is deposited onto a glass substrate by means of vacuum evaporation in which an evaporation mask is employed, and then, an another evaporation mask is employed to thereby form an aluminum layer on the first ferromagnetic layer by evaporation by a thickness in the range of about 1.2 nm to 2.0 nm. Then, the thus formed aluminum layer is exposed to oxygen glow discharge to thereby form a tunnel barrier layer composed of aluminum oxide ($Al_2O_3$) on the aluminum layer. Then, a second ferromagnetic layer composed of Co is formed on the tunnel barrier layer so that the second ferromagnetic layer overlaps the first ferromagnetic layer through the tunnel barrier layer.

Thus, there is completed a cross-electrode type ferromagnetic tunnel junction device. This device provides about 18% of a magneto-resistance ratio at maximum.

Apart from the above-mentioned Journal of Applied Physics, a ferromagnetic tunnel junction device has been suggested in many documents such as Japanese Unexamined Patent Publications Nos. 5-63254, 6-244477, 8-70148, 8-70149, 8-316548, and 9-106514, and Journal of Japan Applied Magnetic Society, Vol. 21, 1997, pp. 493–496. These Publications and Journal have suggested a method of forming a tunnel barrier layer, comprising the steps of forming an aluminum layer, and exposing the aluminum layer to atmosphere to thereby grow an aluminum oxide ($Al_2O_3$) layer.

In an application of a ferromagnetic tunnel junction device to a magnetic head used in an apparatus for reading a high density magnetic disc, it is necessary to reduce a resistance to some degree without increasing a size of the device, in order to minimize thermal noise. To this end, a ferromagnetic tunnel junction device is usually polished at its end surface to thereby define a height of the device with high accuracy, which is perpendicular to a width of the device, ensuring reduction in a resistance.

In an application of a ferromagnetic tunnel junction device to a magnetic head, a surface of a ferromagnetic tunnel junction device faces a recording surface of a magnetic disc, and an intensity of a magnetic field is detected.

In a conventional method of polishing a surface of a ferromagnetic tunnel junction device, a tunnel junction surface is polished on a polishing plate adding dropwise of water or oil including hard diamond particles with a few micrometer in diameter. The surface is mechanically polished by virtue of polishing function and plastic flow function of the hard particles, to thereby flatten.

It is necessary for first and second ferromagnetic layers in a ferromagnetic tunnel junction device to be electrically isolated from each other by a tunnel barrier layer sandwiched therebetween and having a thickness of a couple of nanometers.

However, when a ferromagnetic tunnel junction device is mechanically polished, the first and second ferromagnetic layers are sometimes locally short-circuited with each other by the above-mentioned plastic flow function of hard particles. In other words, since the tunnel barrier layer is quite thin, specifically, has a thickness of a couple of nanometers or smaller, if the first ferromagnetic layer is plastically deformed and fluidized in a polishing direction in the step of mechanically polishing a ferromagnetic tunnel junction device, electrons sometimes pass through the tunnel barrier layer and reach the second ferromagnetic layer from the first ferromagnetic layer.

If the first and second ferromagnetic layers are short-circuited with each other, namely, make direct contact with each other, it would be impossible to sufficiently have the tunnel effect which takes place through the tunnel barrier layer, resulting in deterioration in device performances.

SUMMARY OF THE INVENTION

In view of the above-mentioned problem of the conventional methods of fabricating a ferromagnetic tunnel junction device, it is an object of the present invention to provide a method of doing the same, capable of defining a height of a ferromagnetic tunnel junction device with high accuracy, and keeping first and second ferromagnetic layers in electrical insulation with each other by a tunnel barrier layer.

There is provided a method of fabricating a ferromagnetic tunnel junction device, including the steps of (a) forming a first ferromagnetic layer on a substrate, (b) forming a tunnel barrier layer on the first ferromagnetic layer, (c) forming a second ferromagnetic layer on the tunnel barrier layer, (d) mechanically polishing end surfaces of the first ferromagnetic layer, the tunnel barrier layer, and the second ferromagnetic layer, and (e) etching the surfaces of the first ferromagnetic layer, the tunnel barrier layer, and the second ferromagnetic layer.

There is further provided a method of polishing a surface of a ferromagnetic tunnel junction device comprising a first ferromagnetic layer, a second ferromagnetic layer, and a tunnel barrier layer sandwiched between the first and second ferromagnetic layers, the method including the steps of (a) mechanically polishing end surfaces of the first ferromagnetic layer, the second ferromagnetic layer, and the tunnel barrier layer, and (b) etching the surfaces of the first ferromagnetic layer, the second ferromagnetic layer, and the tunnel barrier layer.

In accordance with the above-mentioned methods, the surfaces of the first ferromagnetic layer, the tunnel barrier layer, and the second ferromagnetic layer are first mechanically polished, and then the thus mechanically polished end surfaces are etched, preferably, dry-etched. Hence, even if the first and second ferromagnetic layers are locally short-circuited with each other during mechanically polished, a short-circuited region in the first and second ferromagnetic layers is removed in the etching step. Accordingly, it is possible to enhance reproduction performance of a ferromagnetic tunnel junction device when used for a magnetic head.

It is preferable that the surfaces are dry-etched.

It is also preferable that a height of the ferromagnetic tunnel junction device is defined in the step of mechanically polishing the surfaces. It would be possible to polish a surface of a ferromagnetic tunnel junction device with high accuracy, when a ferromagnetic tunnel junction device is applied to a magnetic head, ensuring reduction in a resistance of a ferromagnetic tunnel junction device.

For instance, the step of etching the surfaces is comprised of plasma etching, excited gas etching, reactive ion etching, sputter etching, reactive ion beam etching, ion beam etching, or ion milling.

It is preferable that at least one of the first and second ferromagnetic layers is composed of one of Fe, Co, Ni, and an alloy including them.

It is preferable that the tunnel barrier layer is composed of one of metal belonging to lanthanoid, Al, and Mg.

In accordance with the present invention, it is possible to define a height of the ferromagnetic tunnel junction device with high accuracy, and keep the first and second ferromagnetic layers in electrical insulation with each other by the tunnel barrier layer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
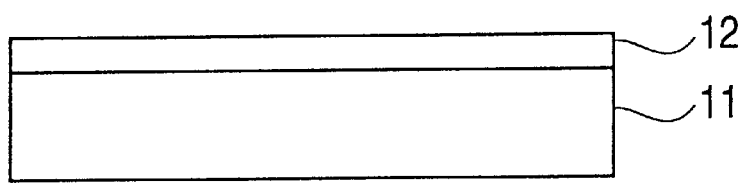
FIGS. 1A, 1B, and 1C are cross-sectional views of a ferromagnetic tunnel junction device, illustrating respective steps of a method of fabricating the same.
Figure 1B:
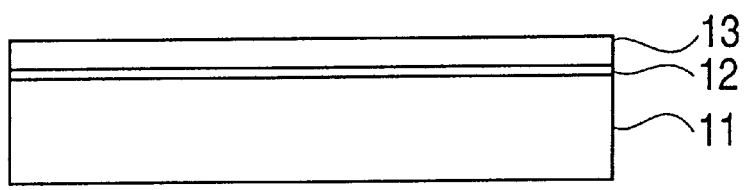
Figure 1C:
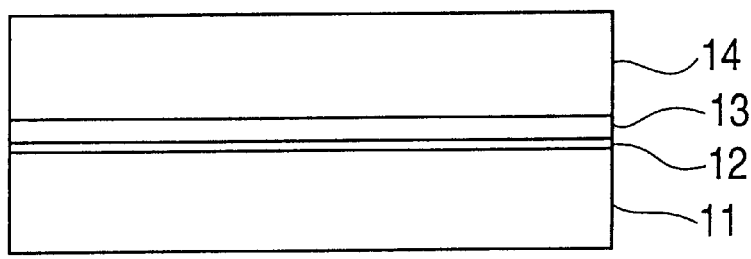

FIGS. 1A to 1C illustrate respective steps of a method of fabricating a ferromagnetic tunnel junction device, in accordance with a preferred embodiment of the present invention.

First, as illustrated in FIG. 1A, a first ferromagnetic layer 11 is formed on a substrate (not illustrated) in a chamber kept in vacuum, and then an electrically conductive layer 12 is formed on the first ferromagnetic layer 11.

Then, pure oxygen gas is introduced into the chamber to naturally oxidize a surface of the electrically conductive layer 12, thereby forming a tunnel barrier layer 13 on the electrically conductive layer 12, as illustrated in FIG. 1B.

Then, a second ferromagnetic layer 14 is formed on the tunnel barrier layer 13, as illustrated in FIG. 1C.

In order to verify the advantages of the ferromagnetic tunnel junction device in accordance with the present invention, samples 1 to 6 were made from the ferromagnetic tunnel junction device having been explained with reference to FIGS. 1A to 1C. The samples 1 to 6 are intermediate products from which a magnetic head is to be fabricated.

FIGS. 2A to 2F illustrate respective steps of a method of fabricating the samples 1 to 6. There was employed a high-frequency magnetron sputtering apparatus including four targets each having a diameter of four inches, for forming films in the samples 1 to 6. Conditions for sputtering were as follows.

Background Pressure: $1 \times 10^{-7}$ Torr or smaller

Argon Pressure: 10 mTorr

High-frequency Power: 200 W

[Sample 1]

Figure 2A:
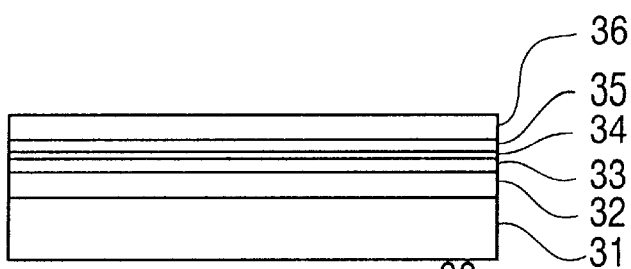
FIGS. 2A to 2F are cross-sectional views of a ferromagnetic tunnel junction device, illustrating respective steps of a method of fabricating a sample of a ferromagnetic tunnel junction device.

The sample 1 was fabricated as follows. First, as illustrated in FIG. 2A, a silicon substrate 31 was thermally oxidized at a surface thereof. Then, a first wiring layer 32 comprised of a 50 nm-thick aluminum film, a first ferromagnetic layer 33 comprised of a 10 nm-thick iron film, and an electrically conductive layer 34 comprised of a 2 nm-thick aluminum film were successively formed on the silicon substrate 31 in this order by sputtering evaporation.

Then, pure oxygen gas was introduced into the magnetron sputtering apparatus. A pressure of the oxygen gas was kept in the range of 20 mTorr to 200 mTorr for about 10 minutes to thereby oxidize a surface of the electrically conductive aluminum layer 34. Thus, there was formed a tunnel barrier layer 35 composed of aluminum oxide on the electrically conductive aluminum layer 34.

Then, the oxygen gas was discharged. After a pressure of the oxygen gas became equal to the predetermined background pressure, a second ferromagnetic layer 36 composed of a 20 nm-thick CoFe film was formed on the tunnel barrier layer 35 by sputtering evaporation. Thus, there was completed a multi-layered structure on the silicon substrate 31.

Figure 2B:
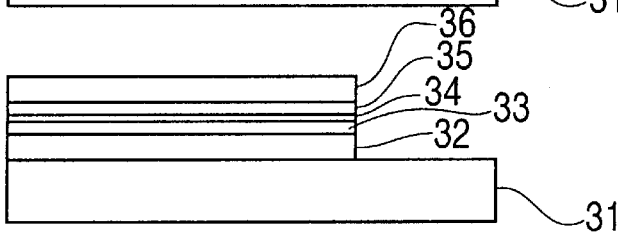

Then, as illustrated in FIG. 2B, the silicon substrate 31 was partially removed to thereby shape all the layers 32, 33, 34, 35, and 36 constituting the multi-layered structure into a lower wiring layer by means of photolithography and ion milling.

Figure 2C:
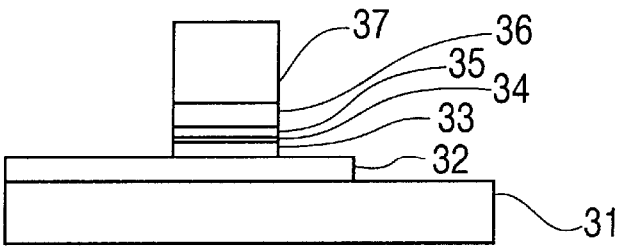

Then, as illustrated in FIG. 2C, a resist pattern 37 was formed on the second ferromagnetic layer 36 for defining a junction dimension. Thereafter, the layers 33, 34, 35, and 36 are patterned by ion milling with the resist pattern 37 being used as a mask.

Figure 2D:
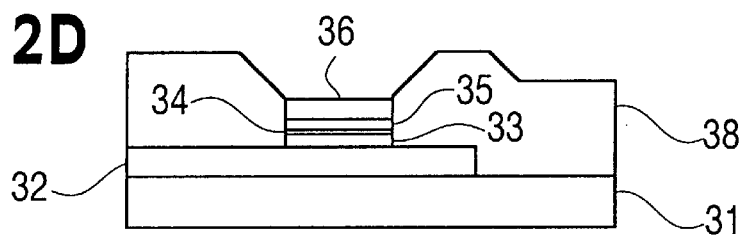

Then, an electrically insulating layer 38 composed of a 300 nm-thick aluminum oxide ($Al_2O_3$) film was evaporated on both the silicon substrate 31 and the first wiring layer 32 by means of electron beams with the resist pattern 37 remaining as it was. Then, the resist pattern 37 was removed by lift-off process, as illustrated in FIG. 2D.

Figure 2E:
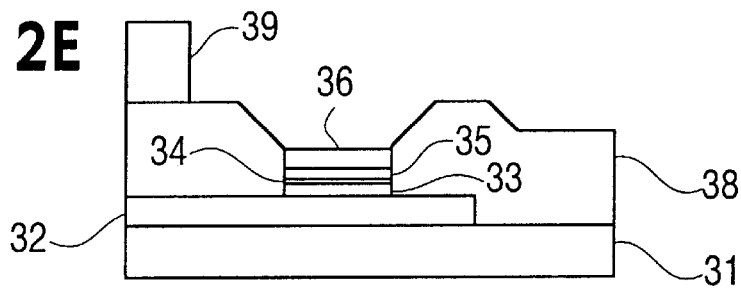

Then, a resist pattern 39 was formed on the electrically insulating layer 38 for forming an upper wiring layer, as illustrated in FIG. 2E. Then, there was implemented reverse sputter cleaning to an exposed surface of the electrically insulating layer 38 in order to ensure electrical contact between the second ferromagnetic layer 36 and a later mentioned second wiring layer 40.

Figure 2F:
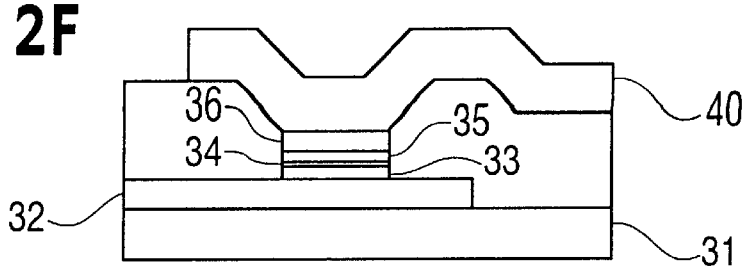

Then, as illustrated in FIG. 2F, a second wiring layer 40 composed of a 200 nm-thick aluminum film was formed over the electrically insulating layer 38 and the second ferromagnetic layer 36 by evaporation. Thereafter, the resist pattern 39 was removed by lift-off process. Thus, there was formed an upper wiring layer, and the sample 1 of the ferromagnetic tunnel junction device was completed.

[Sample 2]

Sample 2 had the same structure as the structure of the above-mentioned sample 1 except that the electrically conductive layer 34 was composed of a 2 nm-thick magnesium film in place of the 2 nm-thick aluminum film.

[Sample 3]

Sample 3 had the same structure as the structure of the above-mentioned sample 1 except that the electrically conductive layer 34 was composed of a 2 nm-thick lanthanum (La) film in place of the 2 nm-thick aluminum film.

[Sample 4]

Sample 4 had the same structure as the structure of the above-mentioned sample 1 except that an $Al_2O_3$ TiC ceramic substrate was employed in place of the silicon substrate 31.

[Sample 5]

Sample 5 had the same structure as the structure of the above-mentioned sample 2 except that an $Al_2O_3$ TiC ceramic substrate was employed in place of the silicon substrate 31.

[Sample 6]

Sample 6 had the same structure as the structure of the above-mentioned sample 3 except that an $Al_2O_3$ TiC ceramic substrate was employed in place of the silicon substrate 31.

Then, the samples 1 to 6 were machined into a bar by means of a dicing saw. Those bars were then mechanically polished in order to define a height of the ferromagnetic tunnel junction device, namely, a length to be measured perpendicularly to a plane of FIG. 2F.

In the step of mechanically polishing the bars, oily polishing solution containing polycrystal diamond particles having an average diameter of about 0.25 $\mu$m was dropped onto a polishing table, and then, each of the bars was compressed onto the polishing table with the polishing table being rotated at 30 r.p.m. and a compression force being set at 5 grams.

Then, a resistance of each of the bars was successively measured. When a resistance reached a predetermined value, the step of mechanically polishing the bar was finished.

Then, polished surfaces of the bars associated with the samples 1 to 6 were dry-etched as follows.

[Embodiment 1]

A ferromagnetic tunnel junction device was fabricated by applying plasma etching to the polished surface of the sample 1.

The plasma etching was carried out under the following conditions.

Plasma Generation System: Inductive Coupling System
Etching Gas: Mixture gas of $O_2$ and $CCl_4$
Etching Gas Pressure: 0.3 Torr
Applied High Frequency Power: 200 W
Substrate Temperature: 60° C.
Etching Time: 20 minutes
Etching Length: about 20 nm

[Embodiment 2]

A ferromagnetic tunnel junction device was fabricated by applying excited gas etching to the polished surface of sample 1.

The excited gas etching was carried out under the following conditions.

Plasma Generation System: Etch Tunnel Microwave Excitation System
Etching Gas: Mixture gas of $O_2$ and $CCl_4$
Etching Gas Pressure: 0.2 Torr
Applied High Frequency Power: 250 W
Substrate Temperature: 50° C.
Etching Time: 100 minutes
Etching Length: about 20 nm

[Embodiment 3]

A ferromagnetic tunnel junction device was fabricated by applying reactive ion etching to the polished surface of the sample 1.

The reactive ion etching was carried out under the following conditions.

Arrangement of Electrodes: Parallel Plate Type
Etching Gas: Mixture gas of $CF_4$ and $H_2$
Etching Gas Pressure: 100 Torr
Applied High Frequency Power: 200 W
Substrate Temperature: 50° C.
Etching Time: 40 minutes
Etching Length: about 20 nm

[Embodiment 4]

A ferromagnetic tunnel junction device was fabricated by applying sputter etching to the polished surface of the sample 1.

The sputter etching was carried out under the following conditions.

Arrangement of Electrodes: Parallel Plate Type
Etching Gas: Ar gas
Etching Gas Pressure: 10 Torr
Applied High Frequency Power: 200 W
Substrate Temperature: 25° C.
Etching Time: 5 minutes
Etching Length: about 30 nm

[Embodiment 5]

A ferromagnetic tunnel junction device was fabricated by applying reactive ion beam etching to the polished surface of the sample 5.

The reactive ion beam etching was carried out under the following conditions.

Ion Generation System: Ion Gun System
Etching Gas: $CCl_4$ gas
Etching Gas Pressure: $8 \times 10^{-4}$ Torr
Ion Acceleration Voltage: 500 V
Ion Current Density: 0.3 mA/cm$^2$
Substrate Temperature: 50° C.
Etching Time: 10 minutes
Etching Length: about 50 nm

[Embodiment 6]

A ferromagnetic tunnel junction device was fabricated by applying ion beam etching to the polished surface of the sample 6.

The ion beam etching was carried out under the following conditions.

Ion Generation System: Ion Gun System
Etching Gas: Ar gas
Etching Gas Pressure: $8 \times 10^{-3}$ Torr
Ion Acceleration Voltage: 600 V
Ion Current Density: 0.2 mA/cm$^2$ Substrate Temperature: 70° C.
Etching Time: 30 minutes
Etching Length: about 50 nm

[Embodiment 7]
A ferromagnetic tunnel junction device was fabricated by applying plasma etching to the polished surface of the sample 2. The conditions for carrying out the plasma etching were identical with those of the Embodiment 1.

[Embodiment 8]
A ferromagnetic tunnel junction device was fabricated by applying plasma etching to the polished surface of the sample 3. The conditions for carrying out the plasma etching were identical with those of the Embodiment 1.

[Embodiment 9]
A ferromagnetic tunnel junction device was fabricated by applying plasma etching to the polished surface of the sample 4. The conditions for carrying out the plasma etching were identical with those of the Embodiment 1.

[Embodiment 10]
A ferromagnetic tunnel junction device was fabricated by applying plasma etching to the polished surface of the sample 5. The conditions for carrying out the plasma etching were identical with those of the Embodiment 1.

[Embodiment 11]
A ferromagnetic tunnel junction device was fabricated by applying plasma etching to the polished surface of the sample 6. The conditions for carrying out the plasma etching were identical with those of the Embodiment 1.

[Embodiment 12]
A ferromagnetic tunnel junction device was fabricated by applying excited gas etching to the polished surface of the sample 2. The conditions for carrying out the excited gas etching were identical with those of the Embodiment 2.

[Embodiment 13]
A ferromagnetic tunnel junction device was fabricated by applying excited gas etching to the polished surface of the sample 3. The conditions for carrying out the excited gas etching were identical with those of the Embodiment 2.

[Embodiment 14]
A ferromagnetic tunnel junction device was fabricated by applying excited gas etching to the polished surface of the sample 4. The conditions for carrying out the excited gas etching were identical with those of the Embodiment 2.

[Embodiment 15]
A ferromagnetic tunnel junction device was fabricated by applying excited gas etching to the polished surface of the sample 5. The conditions for carrying out the excited gas etching were identical with those of the Embodiment 2.

[Embodiment 16]
A ferromagnetic tunnel junction device was fabricated by applying excited gas etching to the polished surface of the sample 6. The conditions for carrying out the excited gas etching were identical with those of the Embodiment 2.

[Embodiment 17]
A ferromagnetic tunnel junction device was fabricated by applying reactive ion etching to the polished surface of the sample 2. The conditions for carrying out the reactive ion etching were identical with those of the Embodiment 3.

[Embodiment 18]
A ferromagnetic tunnel junction device was fabricated by applying reactive ion etching to the polished surface of the sample 3. The conditions for carrying out the reactive ion etching were identical with those of the Embodiment 3.

[Embodiment 19]
A ferromagnetic tunnel junction device was fabricated by applying reactive ion etching to the polished surface of the sample 4. The conditions for carrying out the reactive ion etching were identical with those of the Embodiment 3.

[Embodiment 20]
A ferromagnetic tunnel junction device was fabricated by applying reactive ion etching to the polished surface of the sample 5. The conditions for carrying out the reactive ion etching were identical with those of the Embodiment 3.

[Embodiment 21]
A ferromagnetic tunnel junction device was fabricated by applying reactive ion etching to the polished surface of the sample 6. The conditions for carrying out the reactive ion etching were identical with those of the Embodiment 3.

[Embodiment 22]
A ferromagnetic tunnel junction device was fabricated by applying sputter etching to the polished surface of the sample 2. The conditions for carrying out the sputter etching were identical with those of the Embodiment 4.

[Embodiment 23]
A ferromagnetic tunnel junction device was fabricated by applying sputter etching to the polished surface of the sample 3. The conditions for carrying out the sputter etching were identical with those of the Embodiment 4.

[Embodiment 24]
A ferromagnetic tunnel junction device was fabricated by applying sputter etching to the polished surface of the sample 4. The conditions for carrying out the sputter etching were identical with those of the Embodiment 4.

[Embodiment 25]
A ferromagnetic tunnel junction device was fabricated by applying sputter etching to the polished surface of the sample 5. The conditions for carrying out the sputter etching were identical with those of the Embodiment 4.

[Embodiment 26]
A ferromagnetic tunnel junction device was fabricated by applying sputter etching to the polished surface of the sample 6. The conditions for carrying out the sputter etching were identical with those of the Embodiment 4.

[Embodiment 27]
A ferromagnetic tunnel junction device was fabricated by applying reactive ion beam etching to the polished surface of the sample 2. The conditions for carrying out the reactive ion beam etching were identical with those of the Embodiment 5.

[Embodiment 28]
A ferromagnetic tunnel junction device was fabricated by applying reactive ion beam etching to the polished surface of the sample 3. The conditions for carrying out the reactive ion beam etching were identical with those of the Embodiment 5.

[Embodiment 29]
A ferromagnetic tunnel junction device was fabricated by applying reactive ion beam etching to the polished surface of the sample 4. The conditions for carrying out the reactive ion beam etching were identical with those of the Embodiment 5.

[Embodiment 30]
A ferromagnetic tunnel junction device was fabricated by applying reactive ion beam etching to the polished surface of the sample 5. The conditions for carrying out the reactive ion beam etching were identical with those of the Embodiment 5.

[Embodiment 31]
A ferromagnetic tunnel junction device was fabricated by applying reactive ion beam etching to the polished surface of the sample 6. The conditions for carrying out the reactive ion beam etching were identical with those of the Embodiment 5.

[Embodiment 32]
A ferromagnetic tunnel junction device was fabricated by applying ion beam etching to the polished surface of the sample 2. The conditions for carrying out the ion beam etching were identical with those of the Embodiment 6.

[Embodiment 33]

A ferromagnetic tunnel junction device was fabricated by applying ion beam etching to the polished surface of the sample 3. The conditions for carrying out the ion beam etching were identical with those of the Embodiment 6.

[Embodiment 34]

A ferromagnetic tunnel junction device was fabricated by applying ion beam etching to the polished surface of the sample 4. The conditions for carrying out the ion beam etching were identical with those of the Embodiment 6.

[Embodiment 35]

A ferromagnetic tunnel junction device was fabricated by applying ion beam etching to the polished surface of the sample 5. The conditions for carrying out the ion beam etching were identical with those of the Embodiment 6.

[Embodiment 36]

A ferromagnetic tunnel junction device was fabricated by applying ion beam etching to the polished surface of the sample 6. The conditions for carrying out the ion beam etching were identical with those of the Embodiment 6.

[Embodiment 37]

A ferromagnetic tunnel junction device was fabricated by applying ion milling to the polished surface of the sample 1.

The ion milling was carried out under the following conditions.

Arrangement of Electrodes: Parallel Plate Type

Etching Gas: Ar gas

Etching Gas Pressure: $2 \times 10^{-4}$ Torr

Applied Voltage: 200 V

Ion Current Density: 0.6 mA/cm$^2$

Substrate Temperature: 50° C.

Etching Time: 10 minutes

Etching Length: about 40 nm

[Embodiment 38]

A ferromagnetic tunnel junction device was fabricated by applying ion milling to the polished surface of the sample 1.

The ion milling was carried out under the following conditions.

Arrangement of Electrodes: Parallel Plate Type

Etching Gas: Mixture gas of Ar and O$_2$

Etching Gas Pressure: $2 \times 10^{-4}$ Torr

Applied Voltage: 200 V

Ion Current Density: 0.6 mA/cm$^2$

Substrate Temperature: 50° C.

Etching Time: 15 minutes

Etching Length: about 30 nm

Totally 44 floating type magnetic heads were fabricated of both the ferromagnetic tunnel junction device in accordance with the above-mentioned Embodiments 1 to 38 and the samples 1 to 6 having been mechanically polished. The floating type magnetic heads were designed to have a flotation of 20 nm. By monitoring reproduction characteristic of those magnetic heads to a magnetic disc, the advantages obtained by the etching step were verified.

The magnetic head used for monitoring reproduction characteristic was comprised of a glass substrate and a 10 nm-thick chromium underlying layer, a 20 nm-thick CoCrTaPt magnetic layer, a 10 nm-thick carbon protection layer, and a 2 nm-thick lubricant layer, all of those layers being deposited on the glass substrate in this order. An intensity Hc of a magnetic field was 2400 Oe, and a product Brt of a magnetic flux density and a thickness of the magnetic head was 100 G μm.

A certain solitary wave was recorded in advance into a magnetic disc through the use of a thin film magnetic head having a flotation of 20 nm, and the thus recorded solitary wave was reproduced by means of each of the magnetic heads on which the ferromagnetic tunnel junction devices in accordance with the above-mentioned Embodiments 1 to 38 and the samples 1 to 6 were mounted. Table 1 shows reproduction outputs on the order of mV associated with the obtained sense current density of $5 \times 10^3$ A/cm$^2$ in the Embodiments 1 to 38.

TABLE 1

| | Reproduction Output [mV] | | Reproduction Output [mV] |
|---|---|---|---|
| Embodiment 1 | 4.2 | Embodiment 20 | 2.8 |
| Embodiment 2 | 3.8 | Embodiment 21 | 4.3 |
| Embodiment 3 | 2.9 | Embodiment 22 | 4.1 |
| Embodiment 4 | 3.5 | Embodiment 23 | 3.4 |
| Embodiment 5 | 4.1 | Embodiment 24 | 1.8 |
| Embodiment 6 | 3.5 | Embodiment 25 | 2.7 |
| Embodiment 7 | 3.9 | Embodiment 26 | 1.9 |
| Embodiment 8 | 2.7 | Embodiment 27 | 3.3 |
| Embodiment 9 | 4.2 | Embodiment 28 | 4.2 |
| Embodiment 10 | 3.9 | Embodiment 29 | 3.2 |
| Embodiment 11 | 2.5 | Embodiment 30 | 3.4 |
| Embodiment 12 | 3.6 | Embodiment 31 | 3.8 |
| Embodiment 13 | 4.5 | Embodiment 32 | 2.7 |
| Embodiment 14 | 3.7 | Embodiment 33 | 3.1 |
| Embodiment 15 | 3.2 | Embodiment 34 | 2.3 |
| Embodiment 16 | 2.6 | Embodiment 35 | 3.3 |
| Embodiment 17 | 3.6 | Embodiment 36 | 3.8 |
| Embodiment 18 | 2.6 | Embodiment 37 | 3.6 |
| Embodiment 19 | 3.2 | Embodiment 38 | 2.7 |

Table 2 shows reproduction outputs on the order of mV associated with the obtained sense current density of $5 \times 10^3$ A/cm$^2$ in the samples 1 to 6.

TABLE 2

| | Reproduction Output [mV] | | Reproduction Output [mV] |
|---|---|---|---|
| Sample 1 | 0.56 | Sample 4 | 0.38 |
| Sample 2 | 0.43 | Sample 5 | 0.69 |
| Sample 3 | 0.55 | Sample 6 | 0.47 |

As is understood in view of Table 2, the samples 1 to 6 having been mechanically polished, but not dry-etched provide reproduction outputs all smaller than 0.7 mV. On the other hand, the Embodiments 1 to 38 having been not only mechanically polished but also dry-etched provide reproduction outputs all equal to or greater than 1.8 mV. Namely, the smallest reproduction output is equal to 1.8 mV in the Embodiment 24. The Embodiments 1 to 23 and 25 to 38 all provide reproduction outputs greater than 1.8 mV. Thus, it is verified that the Embodiments 1 to 38 having been not only mechanically polished but also dry-etched provide higher reproduction outputs than those of the samples 1 to 6 having been mechanically polished, but not dry-etched.

As having been explained, mechanically polished end surfaces of the layers 32 to 36 are dry-etched in the method in accordance with the present invention. Hence, even if the first and second ferromagnetic layers 33 and 36 were locally short-circuited while the surfaces thereof are being polished, it would be possible to remove short-circuited portions of the first and second ferromagnetic layers 33 and 36. As a result, the method in accordance with the present invention accurately defines a height of a ferromagnetic tunnel junction device, and further keeps the first and second ferromagnetic layers 33 and 36 electrically insulated from each other through the tunnel barrier layer 35, ensuring an enhancement in a fabrication yield of a ferromagnetic tunnel junction device.

In addition, when the ferromagnetic tunnel junction device is used as a magnetic head for reading a highly densified magnetic disc, it is possible to flatten a plane of the magnetic head, which faces the magnetic disc. This ensures a magnetic head having a practically required resistance and a signal-output voltage characteristic, and providing extremely high reproduction output.

For instance, a fabrication yield of a reproducible magnetic head was about 30% in accordance with a conventional method of fabricating a ferromagnetic tunnel junction device. On the other hand, a fabrication yield of a reproducible magnetic head is 70% or greater in accordance with the present invention in which end surfaces of layers deposited on a substrate are not only mechanically polished, but also dry-etched.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-342592 filed on Dec. 12, 1997 including specification, claims, drawings and summary is incorporated herein by reference in its entirety.

What is claimed is:

1. A method of fabricating a ferromagnetic tunnel junction device, comprising the steps of:

(a) forming a first ferromagnetic layer on a substrate;

(b) forming a tunnel barrier layer on said first ferromagnetic layer;

(c) forming a second ferromagnetic layer on said tunnel barrier layer;

(d) mechanically polishing end surfaces of said first ferromagnetic layer, said tunnel barrier layer, and said second ferromagnetic layer; and (e) etching said end surfaces of said first ferromagnetic layer, said tunnel barrier layer, and said second ferromagnetic layer.

2. The method as set forth in claim 1, wherein said step (e) is comprised of dry etching.

3. The method as set forth in claim 1, wherein a height of said ferromagnetic tunnel junction device is defined in said step (d).

4. The method as set forth in claim 1, wherein said step (e) is comprised of one of plasma etching, excited gas etching, reactive ion etching, sputter etching, reactive ion beam etching, ion beam etching, and ion milling.

5. The method as set forth in claim 1, wherein said first ferromagnetic layer is composed of one of Fe, Co, Ni, and an alloy including them.

6. The method as set forth in claim 1, wherein said second ferromagnetic layer is composed of one of Fe, Co, Ni, and an alloy including them.

7. The method as set forth in claim 1, wherein said tunnel barrier layer is composed of one of metal belonging to lanthanoid, Al, and Mg.

8. A method of polishing a surface of a ferromagnetic tunnel junction device comprising a first ferromagnetic layer, a second ferromagnetic layer, and a tunnel barrier layer sandwiched between said first and second ferromagnetic layers, said method comprising the steps of:

(a) mechanically polishing end surfaces of said first ferromagnetic layer, said second ferromagnetic layer, and said tunnel barrier layer; and (b) etching said end surfaces of said first ferromagnetic layer, said second ferromagnetic layer, and said tunnel barrier layer.

9. The method as set forth in claim 8, wherein said step (b) is comprised of dry etching.

10. The method as set forth in claim 8, wherein a height of said ferromagnetic tunnel junction device is defined in said step (a).

11. The method as set forth in claim 8, wherein said step (b) is comprised of one of plasma etching, excited gas etching, reactive ion etching, sputter etching, reactive ion beam etching, ion beam etching, and ion milling.

12. The method as set forth in claim 8, wherein said first ferromagnetic layer is composed of one of Fe, Co, Ni, and an alloy including them.

13. The method as set forth in claim 8, wherein said second ferromagnetic layer is composed of one of Fe, Co, Ni, and an alloy including them.

14. The method as set forth in claim 8, wherein said tunnel barrier layer is composed of one of metal belonging to lanthanoid, Al, and Mg.

* * * * *